US006498536B1

(12) United States Patent
Mori

(10) Patent No.: US 6,498,536 B1
(45) Date of Patent: Dec. 24, 2002

(54) OSCILLATING CIRCUIT FOR PRODUCING AN OUTPUT SIGNAL SYNCHRONOUS WITH AN INPUT SIGNAL

(75) Inventor: Kenji Mori, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/568,677

(22) Filed: May 11, 2000

(30) Foreign Application Priority Data

May 13, 1999 (JP) ............................................ 11-132464

(51) Int. Cl.$^7$ ........................ H03L 7/085; H03L 7/095; H03L 7/10
(52) U.S. Cl. ........................... 331/11; 331/1 A; 331/14; 331/25; 331/DIG. 2; 327/156; 327/159
(58) Field of Search ............................ 331/1 A, 10, 11, 331/14, 17, 18, 25, DIG. 2; 327/156–159; 455/260; 375/376

(56) References Cited

U.S. PATENT DOCUMENTS 3,825,855 A * 7/1974 Basset et al. ................ 331/1 A
5,600,279 A * 2/1997 Mori .......................... 331/36 C
5,982,208 A * 11/1999 Kokubo et al. ............... 327/119

FOREIGN PATENT DOCUMENTS

| JP | 2-100348 | 8/1990 |
| JP | 3-274917 | 12/1991 |
| JP | 5-268078 | 10/1993 |
| JP | 9-246963 | 9/1997 |
| JP | 10-164395 | 6/1998 |

* cited by examiner

Primary Examiner—David C. Mis
(74) Attorney, Agent, or Firm—Dickstein, Shapiro, Morin & Oshinsky LLP

(57) ABSTRACT

An oscillating circuit removes a phase difference from between an input signal variable in frequency and a free-running oscillation signal through a two-step voltage-to-frequency control, wherein a frequency comparator, a detector, a flip flop circuit cooperates with a counter so as to vary a control range of the voltage-controlled oscillator in the vicinity of the input frequency, and, thereafter, a phase comparator makes the free-running oscillation signal synchronous with the input signal through the phase comparison therebetween, even if the voltage-to-frequency characteristics of the voltage-controlled oscillator is deviated from a design range, the deviation is taken up through the first-step control so that the manufacturer can delete an external regulator from the oscillating circuit.

12 Claims, 6 Drawing Sheets

OSCILLATING CIRCUIT FOR PRODUCING AN OUTPUT SIGNAL SYNCHRONOUS WITH AN INPUT SIGNAL

FIELD OF THE INVENTION

This invention relates to an oscillator and, more particularly, to an oscillator for an oscillating signal synchronous with an input signal.

DESCRIPTION OF THE RELATED ART

A monitor display is usually connected to a personal computer. A video signal is supplied to the monitor display, and carries pictures at synchronizing frequencies depending upon the number of pixels defined in a VGA (Variable Graphic Array) or an SVGA (Super Variable Graphic Array), by way of example. Even though the video signal is supplied to the monitor display at different synchronizing frequencies, it is necessary that the picture size and the location of the picture are stable on the screen of the monitor display. For this reason, a multi-sink monitor display is widely used for the video signal supplied at different frequencies.

A synchronous signal processing circuit is integrated on a semiconductor chip, and the semiconductor integrated circuit device is incorporated in the multi-sink monitor display. The synchronous signal processing circuit achieves an automatic regulation for the horizontal output frequency, and the automatic horizontal frequency regulation circuitry is responsive to variation of the horizontal input frequency so as to make the free running oscillating frequency follow the horizontal input frequency. The phase and the frequency of the free running oscillating signal are coincident with those of the horizontal input signal.

FIG. 1 illustrates the prior art automatic horizontal frequency regulation circuitry. The prior art automatic horizontal frequency regulation circuitry comprises a counter 51, a digital-to-analog converter 52, a voltage-controlled oscillator 53 and a phase comparator 54. The counter 51 is connected to the digital-to-analog converter 52, which in turn is connected to the voltage-controlled oscillator 53. The voltage-controlled oscillator 53 and a signal input node are connected to the phase comparator, and the phase comparator 54 regulates the oscillation frequency through the comparison between the input signal at the input node 101 and the free-running oscillation signal 503.

The prior art automatic horizontal frequency regulation circuitry behaves as follows. FIG. 2 shows the relation between the input frequency and a control voltage signal 502. The digital-to-analog converter 52 linearly increases the magnitude of the control voltage signal 502 together with the input frequency, and the counter 51 and the digital-to-analog converter 52 uniquely determines the magnitude of the control voltage signal 502 on the basis of the input frequency. On the other hand, the relation between the control voltage signal 502 and the free-running oscillation signal 503 is shown in FIG. 3. The frequency f0 is linearly increased together with the magnitude of the control voltage signal 502. Thus, the voltage-controlled oscillator 52 uniquely determines the free-running oscillation frequency on the basis of the magnitude of the control voltage signal. When the gradient of the plots is appropriately regulated, the voltage-controlled oscillator 53 varies the frequency of the free-running oscillation signal 503 in such a manner as to become coincident with the input frequency.

A problem is encountered in the prior art automatic horizontal frequency regulation circuitry in that a post regulation is required after the completion of the fabrication process. In detail, the voltage-controlled oscillator 53 repeats the charge into capacitors and the discharge therefrom for oscillating the free-running signal. The circuit components of the prior art automatic horizontal frequency regulation circuitry are integrated on a semiconductor chip through the fabrication process, and the capacitors are also formed on the semiconductor chip. However, the capacitance is liable to be dispersed, and the relation between the magnitude of the control voltage signal and the free-running frequency is not constant among the products. For example, if the voltage-controlled oscillator 53 is designed as indicated by real line in FIG. 4, the voltage-controlled oscillator 53 of a product may have the voltage-to-frequency characteristics indicated by broken line. In this instance, the free-running frequency is f02 at the control voltage signal v1, and is different from the designed frequency f01. When the difference exceeds the control range of the loop consisting of the voltage-controlled oscillator 53 and the phase comparator 54, the prior art automatic horizontal frequency regulation circuitry can not output any in-phase signal. In order to rescue the defective products from rejection, an external regulation circuit is required for the prior art automatic horizontal frequency regulation circuitry, and the manufacturer carries out the post regulation by using the external regulation circuit. The external regulation circuit makes the prior art synchronous signal processing circuit large, and increases the production cost thereof. Although discrete capacitors may avoid the problems, the semiconductor integrated circuit device requires additional pins to be connected to the discrete capacitors, and the discrete capacitors are not feasible.

SUMMARY OF THE INVENTION

It is therefore an important object of the present invention to provide an oscillation circuit, which automatically synchronizes an output oscillation signal with an input signal without any additional regulation circuit.

To accomplish the object, the present invention proposes to vary the control range of a voltage-controlled oscillator in the vicinity of the frequency of an input signal.

In accordance with one aspect of the present invention, there is provided a oscillating circuit for producing an output signal synchronous with an input signal comprising a signal input node supplied with the input signal, a voltage-controlled oscillator having voltage-to-frequency characteristics achieved in a certain control range and responsive to a control voltage signal for changing a frequency of the output signal, a first control loop connected to the signal input node and the voltage-controlled oscillator so as to compare the frequency of the output signal with an frequency of the input signal to see whether or not the input signal falls within the certain control range and changing a first sub-signal of the control signal so as to make the input signal fall within the certain control range when the input signal is out of the certain control range, and a second control loop connected to the signal input node and the voltage-controlled oscillator and controlling the voltage-controlled oscillator with a second sub-signal of the control signal so as to make the output signal and the input signal in-phase.

BRIEF DESCRIPTION OF THE DRAWINGS

The features and advantages of the oscillator will be more clearly understood from the following description taken in conjunction with the accompanying drawings in which.

DESCRIPTION OF THE PREFERRED EMBODIMENTS

First Embodiment

Figure 5:
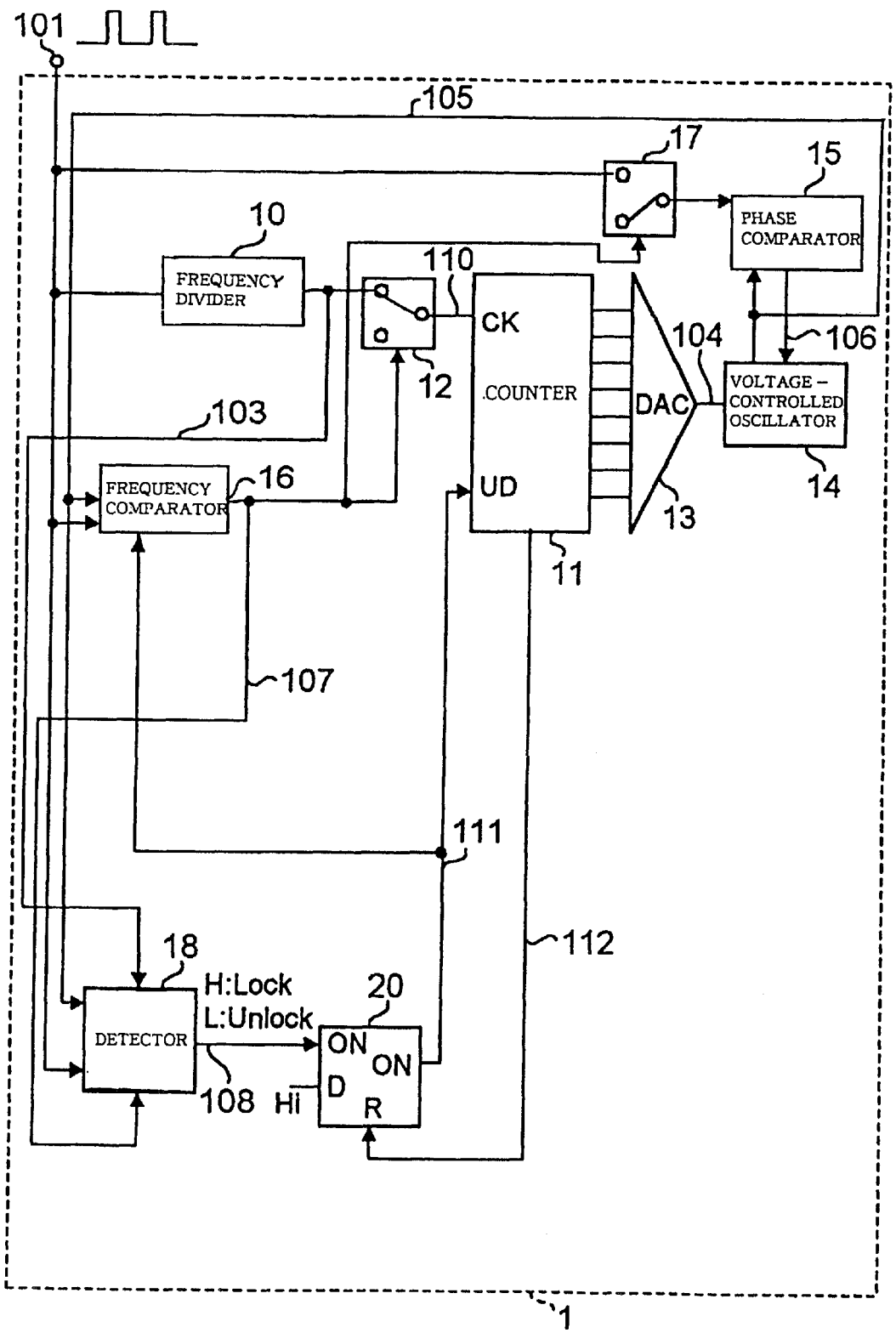
FIG. 5 is a block diagram showing the circuit configuration of a self-tunable oscillating circuit according to the present invention.

Referring to FIG. 5 of the drawings, a self-tunable oscillating circuit 1 embodying the present invention comprises a frequency divider 10, a counter 11, a switching circuit 12, a digital-to-analog converter 13, a voltage-controlled oscillator 14, a phase comparator 15, a frequency comparator 16, a switching circuit 17, a detector 18 and a flip-flop circuit 20. The frequency divider 10, the switching circuits 12/17, the frequency comparator 16, the detector 18 and the flip-flop circuit 20 are newly added to the frequency regulator 11/13/14/15.

An input node 101 is directly connected to the input node of die frequency divider 10, the frequency comparator 16 and the detector 18, and through the switching circuit 17 to the phase comparator 15. An input signal is supplied to the frequency divider 10, the frequency comparator 16 and the detector 18 at all times. The switching circuits 12/17 are responsive to a control signal 107 so as to offer signal paths to or block the counter/phase comparator 11/15 from signals passing there through depending upon the control signal 107. The control signal 107 is further supplied to the detector 18. The control signal is changed between an active level representative of coincidence in frequency between the input signal and a free-running oscillation signal and an inactive level representative of difference in frequency therebetween. While the switching circuit 17 offers the signal path to the input signal, the input signal is transferred through the switching circuit 17 to the phase comparator 15. The frequency divider 10 is connectable through the signal path of the other switching circuit 12 to the clock node CK of the counter 11.

The frequency divider 10 produces a pulse signal 103 different in frequency from the input signal, and supplies the pulse signal to the switching circuit 12 and the detector 18. The switching circuit 12 is connected between the output node of the frequency divider 10 and a clock node CK of the counter 11, and transfers the pulse signal 103 to the clock node CK in the presence of the control signal 107 of the inactive level. If the control signal 107 is active, the switching circuit 12 interrupts the pulse signal.

While the switching circuit 12 is transferring the pulse signal 103 to the clock node CK, the counter 11 increments the binary number stored therein, and changes the output signal representative of the binary number. The output signal is supplied from the counter 11 to the digital-to-analog converter 13, and is converted to a control voltage signal 104 proportional to the current binary number. The control voltage signal 104 is supplied to the voltage-controlled oscillator 14, and the voltage-controlled oscillator 14 oscillates at a frequency proportional to the magnitude of the control voltage signal 104. The voltage-controlled oscillator 14 supplies a free-running oscillation signal 105 to the phase comparator 15, the frequency comparator 16 and the detector 18. The lowest frequency of the voltage-controlled oscillator 14 is less than the lowest frequency of the input signal.

The phase comparator 15 compares the free-running oscillation signal 105 with the input signal to see whether or not any phase difference takes place. The phase comparator 15 produces a control signal 106 on the basis of the comparison between the free-running oscillation signal and the input signal. The voltage-controlled oscillator 14 varies the frequency of the free-running oscillation signal with the control signal 106 in such a manner as to make the free-running oscillation signal coincident with the input signal.

The frequency comparator 16 compares the free-running oscillation signal with the input signal to see whether or not the free-running oscillation signal is equal in frequency to the input signal. When the free-running oscillation signal is equal in frequency to the input signal, the frequency comparator 16 changes the control signal 107 to the active level. However, if the free-running oscillation signal is different in frequency from the input signal, the frequency comparator 16 keeps the control signal 107 inactive.

The detector 18 is responsive to the control signal 107 of the active level so as to delay the activation thereof by using the pulse signal 103. After the delay time, the detector 18 compares the input signal with the free-running oscillation signal to see whether or not there is any phase difference there between. When the free-running signal and the input signal are in-phase, the detector 18 changes a control signal 108 to a high level representative of the locked state. However, if the phase difference is found between the free-running oscillation signal 105 and the input signal, the detector 18 keeps the control signal 108 in a low level. The control signal 108 of the low level is representative of the unlocked state.

The flop-flop circuit 20 has a first node ON, a second node ON, a data node D and a reset node R. The first node ON is connected to the output node of the detector 18, and the second node ON is connected to a control node UD of the counter 11. The data node is supplied with a data signal Hi, and the reset node R is connected to the counter 11. The flip-flop circuit 20 latches the data signal Hi at the trailing edge of the control signal 108. The flip-flop 20 supplies a control signal 111 representative of the count-up mode or the count-down mode to the control node UD. When the counter 11 reaches value 00, the counter 11 supplies a reset signal 112 to the reset node R, and the flip-flop circuit 20 is reset.

Figure 6:
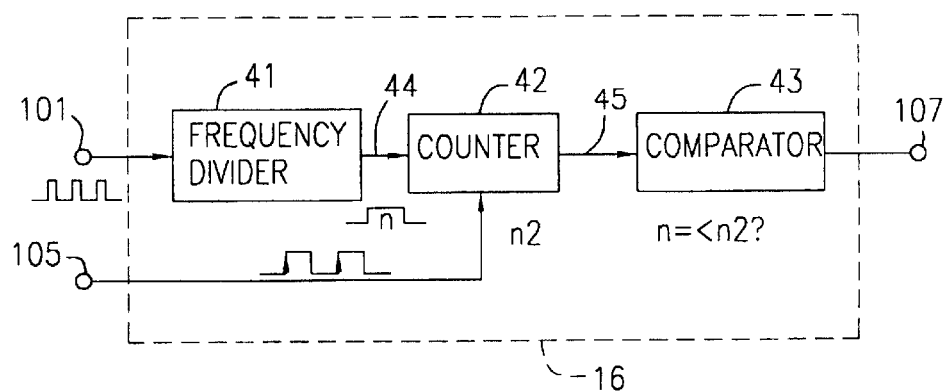
FIG. 6 is a block diagram showing the circuit configuration of a frequency comparator 16 incorporated in the self-tunable oscillating circuit.

FIG. 6 shows the circuit configuration of the frequency comparator 16. The frequency comparator 16 includes a frequency divider 41 connected to the input node 101, a counter 42 connected to the frequency divider 41 and the phase comparator 15 and a comparator 43 connected to the counter 42. The frequency divider 41 produces a window pulse whose frequency is a submultiple n of the frequency of the input signal. The window pulse signal 44 is supplied to the counter 42. While the window pulse 44 is staying at the active high level, the counter 42 counts the pulses of the free-running oscillation signal 105. When the window pulse signal 44 is changed to the low level, the counter 42. supplies an output signal 45 representative of the number n2 of pulses to the comparator 43. The comparator 43 compares the number n2 of pulses with the submultiple n. When the number n2 of pulses is equal to the submultiple n, the comparator 43 changes the control signal 107 to the active level representative of the consistence.

Figure 7:
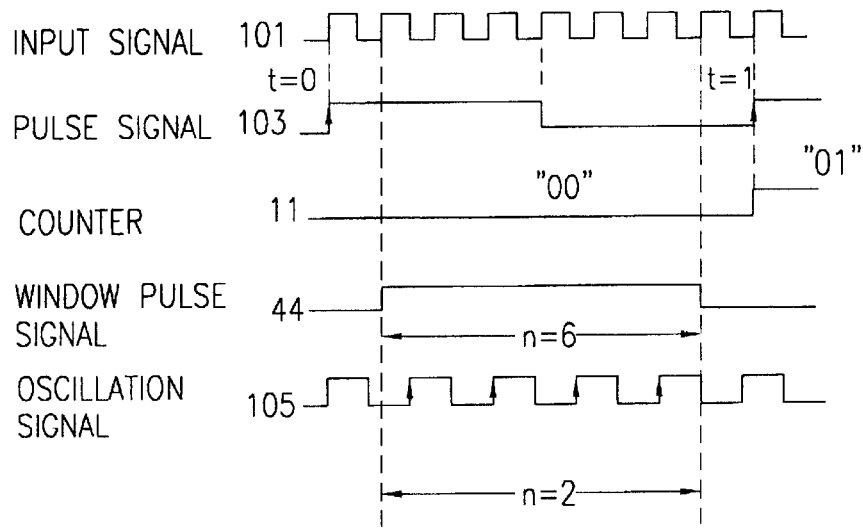
FIG. 7 is a timing chart showing the circuit behavior of a frequency comparator incorporated in the self-tunable oscillating circuit.

Assuming now that the frequency divider 10 divides the input signal by 8, the self-tunable oscillating circuit 1 according to the present invention behaves as shown in FIG. 7. The submultiple n is arbitrarily given to the frequency divider 41 in so far as it is equal to or less than 8. In this instance, the submultiple n is assumed to be 6.

The input signal 101 rises at time t=0, the frequency divider 10 produced the pulse signal 103, whose pulse period is eight times longer than that of the pulse of the input signal. The pulse signal is supplied through the switching circuit 12 to the clock node CK of the counter 11 as the pulse signal 110. The counter 11 keeps the binary number at 00 daring the first pulse period of the pulse signal 110. The pulse signal 110 rises at time t=1, and the counter 11 advances one count, The count stored therein is changed from 00 to 01. Since the frequency comparator 16 is expected to control the switching circuits 12/17 with the control signal 107, the frequency divider 41 produces the window pulse signal 44 before the counter 11 advances the count with the pulse signal 103/110.

As described herein before, the submultiple n is 6, and the frequency divider 41 keeps the window pule signal 44 in the high level for a time period equivalent to the six pulses of the input signal. While the window pulse signal 44 is staying in the high level, the counter 42 advances the count. In this instance, four pulses fall in the range defined by the window pulse signal 44, and the counter 42 counts the four pulses. Thus n2 is 4. The comparator 43 compares the number of the pulses n2 with the submultiple n, and determines that the number n2 of the pulses is less than the submultiple n. Then, the frequency comparator 16 keeps the control signal 107 in the inactive level. The flip-flop circuit 20 supplies the control signal 111 representative of the count-up mode, and the counter 11 advances one count with the control signal 111.

Figure 8:
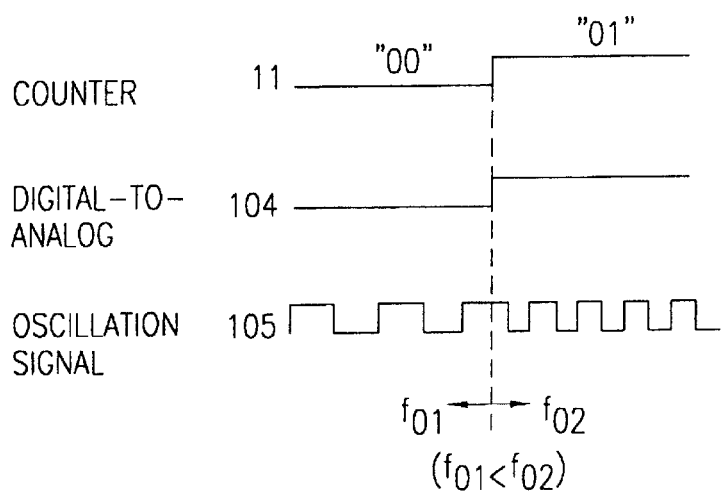
FIG. 8 is a timing chart showing the circuit behavior of a voltage-controlled oscillator 14 incorporated in the self-tunable oscillating circuit.

FIG. 8 shows the behavior of the voltage-controlled oscillator 14. When the counter 11 advances the count from 00 to 01, the digital-to-analog converter 104 increases the magnitude of the control voltage signal 104, and the control voltage signal 104 is supplied to the voltage-controlled oscillator 14. Then, the voltage-controlled oscillator 14 increases the oscillating frequency from f01 to f02. Thus, when the number n1 of the pulses is less than the submultiple n, the counter 11 advances the count by one, and voltage-controlled oscillator 14 increases the oscillation frequency.

The self-tunable oscillating circuit 1 repeats the above-described control sequence until the number of pulses in the window pulse signal 44 is equal to the submultiple n. The input signal 101 is asynchronous with the free-running oscillating signal 106, and, accordingly, the number of pulses may be possibly different depending upon the timing for raising the window pulse signal 44. This means that, even if the number of pulses is equal to the sub-multiple n, there is a possibility that the frequency comparator 16 instructs the count-up operation to the counter 11. In order to avoid it, a register (not shown) may set a limit on the maximum count of the counter 42. Even if the number of pulses reaches n before the decay of the window pulse signal 44, the register does not allow the counter 42 to advance the count, and the comparator 43 changes the control signal 107 to the active level representative of the consistence.

Figure 9:
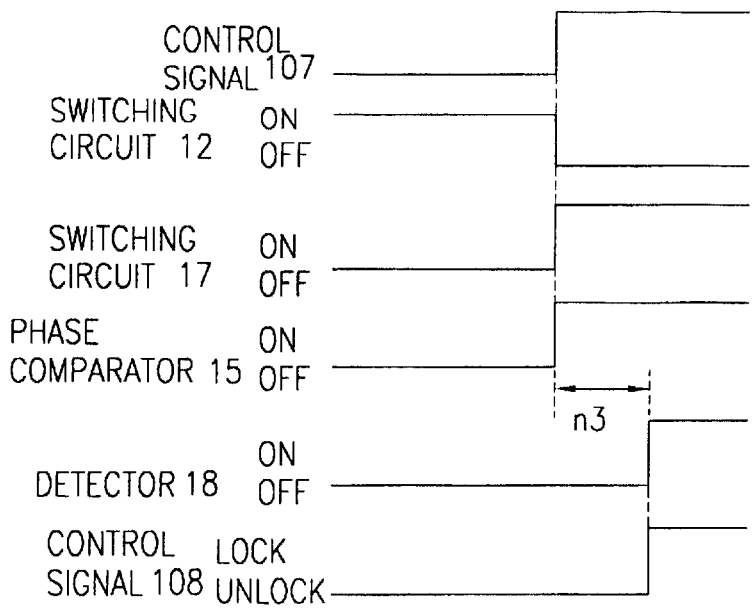
FIG. 9 is a timing chart showing the circuit behavior of a detector incorporated in the self-tunable oscillating circuit.

FIG. 9 shows the behavior of the detector 18. When the frequency comparator 16 changes the control signal 107 to the active level representative of the consistence, the switching circuit 12 turns off, and the other switching circuit 17 turns on. The switching circuit 12 blocks the clock node CK from the pulse signal 103, and the pulse signal 110 is not supplied to the clock node CK of the counter 11. The counter 11 keeps the count. On the other hand, the switching circuit 17 supplies the input signal to the phase comparator 15, and the phase comparator 15 compares the free-running oscillation signal 106 with the input signal, and supplies the control signal 106 representative of the phase difference to the voltage-controlled oscillator 14.

When the detector 18 receives the control signal 107 representative of the coincidence, the detector 18 starts the delay time n3 The delay time n3 is introduced into the activation of the detector 18 by using the pulse signal 103. When the delay time period n3 is expired, the detector 18 is activated so as to compare the free-running oscillation signal 105 with the input signal to see whether or not phase difference takes place therebetween. The amount delay time is dependent on the speed of the response inherent in the phase comparator 15. The delay time is adjusted to an appropriate value in such a manner that the detector 18 is activated after the phase comparator 15 makes the input signal and the free-running oscillation signal in-phase. When the free-running oscillation signal 105 is in-phase to the input signal, the detector 18 changes the control signal 108 to the high level representative of the locked state. If the phase difference takes place between the free-running oscillation signal 105 and the input signal, the detector 18 keeps the control signal 108 to the low level representative of the unlocked state.

Figure 10:
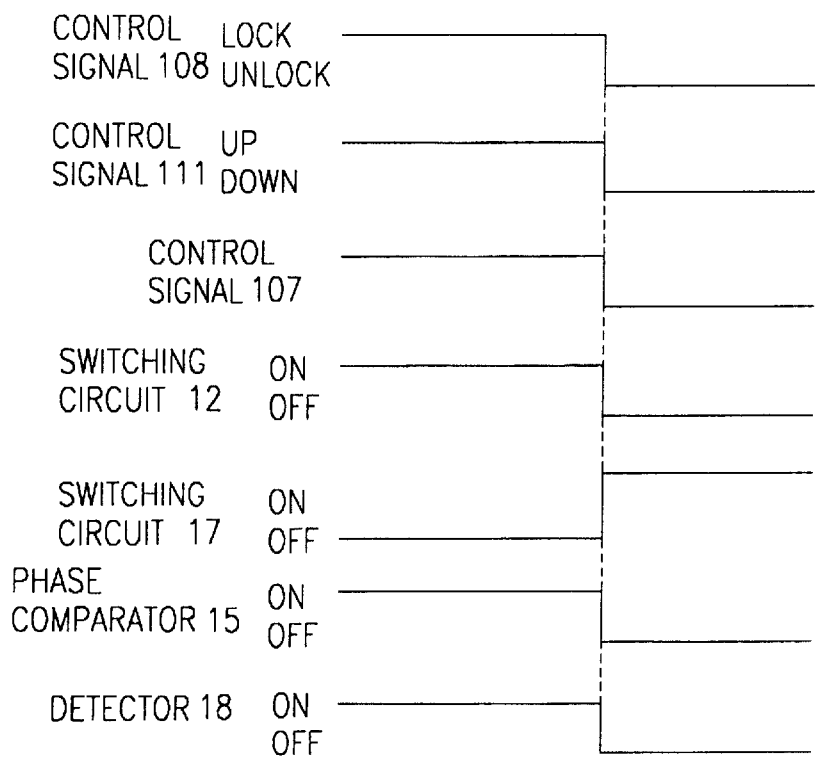
FIG. 10 is a timing chart showing the circuit behavior of a counter incorporated in the self-tunable oscillating circuit.

FIG. 10 shows the circuit behavior of the counter 11. Assuming now that the input signal 101 varies the frequency thereof after entry into the locked state, phase difference takes place between the input signal and the free-running oscillation signal 105. This results in that the change of the control signal 108 from the high level to the low level. The flip-flop circuit 20 is responsive to the control signal 108 so as to change the control signal 111 to the low level representative of the count-down mode.

The control signal 111 is supplied to the control node UD of the counter 11. The counter 11 is responsive to the control signal 111 so as to change the operation to the count-down mode. The frequency comparator 16 is deactivated, and does not output the control signal 107. Then, the switching circuit 12 turns on, and the pulse signal 103 is transferred to the clock node CK of the counter 11. On the other hand, the switching unit 17 turns off, and interrupts the input signal. The counter 11 starts the count-down operation in response to the pulse signal 110. When the count reaches 00, the counter 11 supplies the reset signal 112 to the reset node R of the flip-flop circuit 20. The reset signal 112 causes the flip-flop circuit 20 to change the control signal 111 to the high level representative of the count-up mode. If the pulse signal 110 is supplied to the clock node CK at the change from the count-down mode to the count-up mode, the counter 11 starts the count-up operation in response to the pulse signal 110. While the counter 11 is decrementing the binary number stored therein in response to the pulse signal 110, the frequency comparator 16 does not output the control signal 107 representative of the coincidence, and, accordingly, the detector never compares the input signal with the free-running oscillation signal 105.

Figure 1:
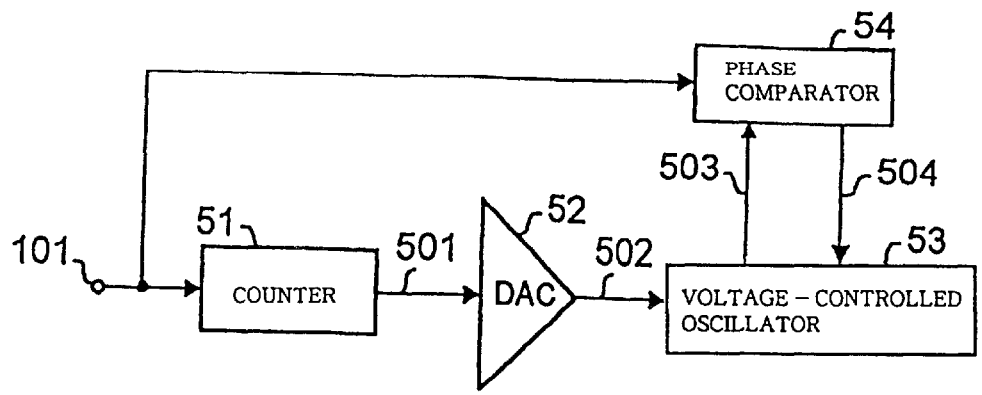
FIG. 1 is a block diagram showing the circuit configuration of the prior art horizontal frequency automatic regulation circuitry.
Figure 11:
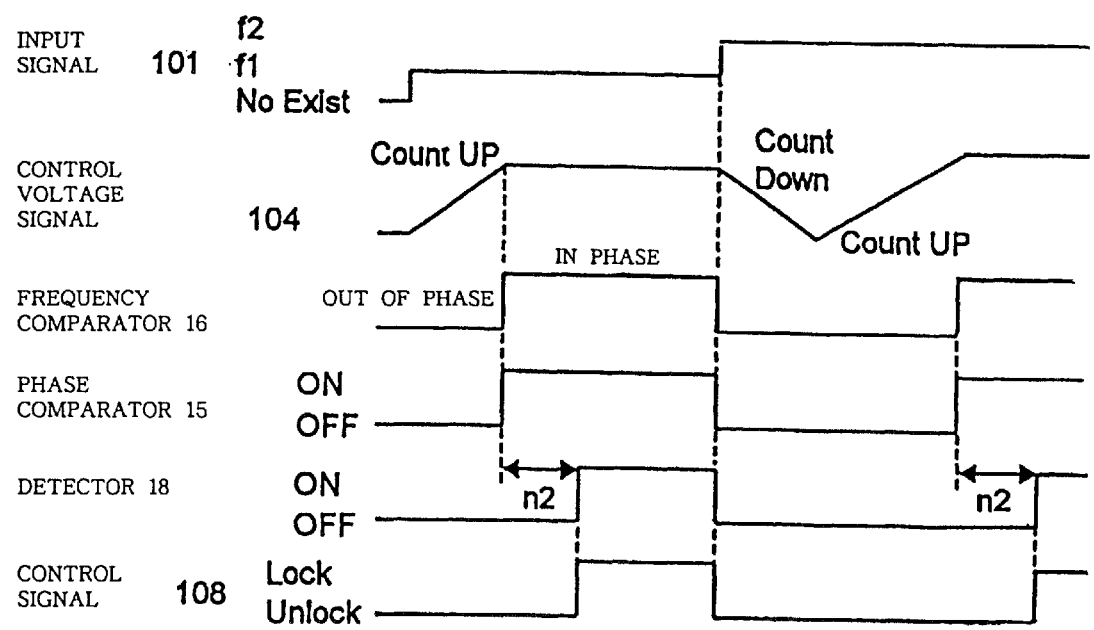
FIG. 11 is a timing chart showing the circuit behavior of the self-tunable oscillating circuit.
Figure 2:
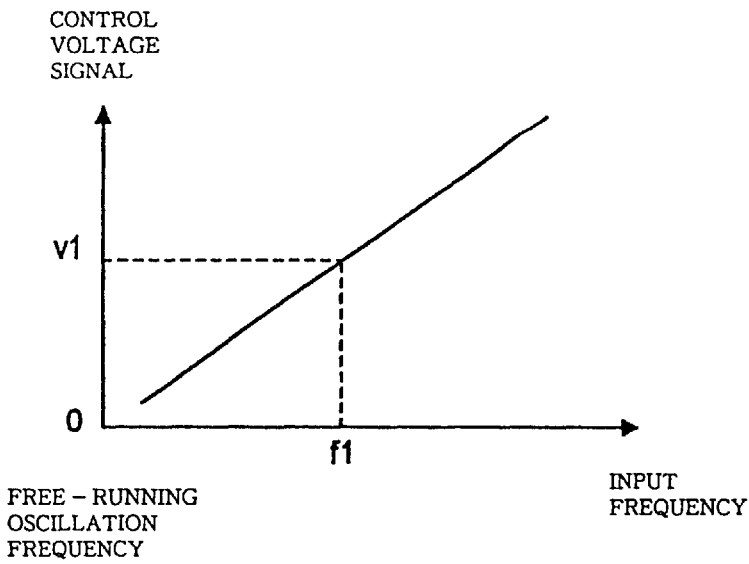
FIG. 2 is a graph showing the relation between the input frequency and the control voltage signal.
Figure 3:
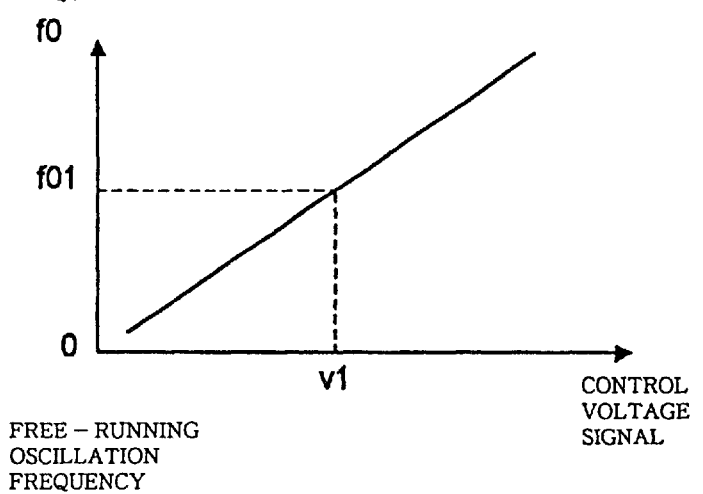
FIG. 3 is a graph showing the relation between the control voltage signal and the free-running oscillation frequency.
Figure 4:
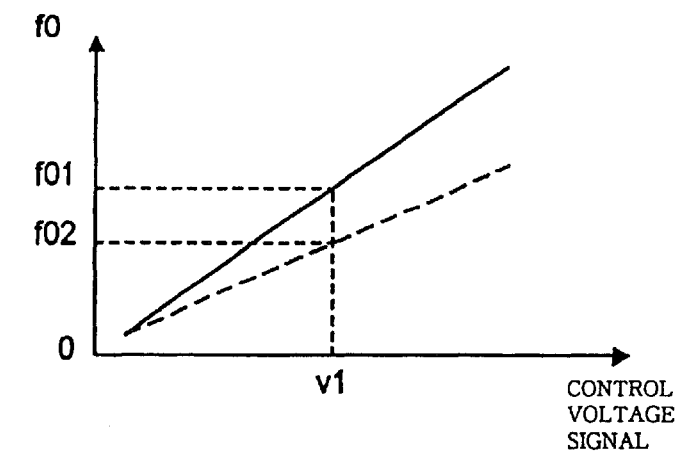
FIG. 4 is a graph showing the voltage-to-frequency characteristics of the voltage-controlled oscillators in the different products.

In detail, the FIG. 11 shows the circuit behavior of the self-tunable oscillating circuit 1. The input signal 101 is assumed to have frequency f1. The flip-flop circuit 20 outputs the control signal 111, of the high level in the initial state. The frequency divider 10 supplies the pulse signal 103/110 through the switching circuit 12 to the clock node CK of the counter 11, and the counter 11 starts the count-up operation in response to the pulse signal 110. The output signal of the counter 11 is representative of the count advanced with the pulse signal 110, and is supplied to the digital-to-analog converter 13. The digital-to-analog converter 13 raises the magnitude of the control voltage signal 104, and, accordingly, the voltage-controlled oscillator 14 increases the frequency of the free-running oscillation signal 105. The free-running oscillation signal 105 is supplied to the phase comparator 15, the frequency comparator 16 and the detector 18.

The frequency comparator 16 compares the free-running oscillation signal 105 with the input signal to see whether or not the phase of the free-running oscillation signal 105 is substantially coincident with the phase of the input signal. When the frequency comparator 16 finds the coincidence, the frequency comparator 16 changes the control signal 107 to the high level representative of the coincidence, and supplies the control signal 107 to the switching circuits 12/17 and the detector 18.

The switching circuit 12 turns off, and interrupts the pulse signal 103/110. Then, the counter 11 stops the count-up operation, and keeps the binary number representative of the pulses already supplied thereto. On the other hand, the switching circuit 17 turns on, and transfers the input signal from the input node 101 to the phase comparator 15. The phase comparator 15 starts the phase-comparison between the free-running oscillation signal 105 and the input signal.

The control signal 107 makes the detector 18 count the delay time n3, and the detector 18 is activated after expiry of the time period n3. Then, the detector 18 compares the free-running oscillation signal 105 with the input signal to see whether or not the phase of the free-running oscillation signal 105 is coincident with the phase of the input signal. When the detector 18 finds the coincidence therebetween, the detector 18 changes the control signal 108 to the high level representative of the coincidence. On the other than, if the phase difference is found, the detector 18 changes the controls signal 108 to the low level representative of the phase difference. The phase comparator 15 supplies the control signal 106 so as to vary the frequency of the free-running oscillation signal 105 in the delay time period n2, and removes the phase difference from between the free-oscillation signal 105 and the input signal. When the phase difference is removed from between the free-running oscillation signal 105 and the input signal, the detector 18 changes the control signal 108 to the high level representative of th locked state. With the control sign 108 of the high level, the flip-flop circuit 20 transfers the data signal Hi to the control node UD as the control signal 111.

The input signal is assumed to vary the frequency from f1 to f2. The detector 18 finds that the free-running oscillation signal and the input signal are out of phase, and changes the control signal 108 to the low level representative of the unlocked state. The frequency comparator 16 finds phase difference between the free-running oscillation signal and the input signal, and changes the control signal 107 to the inactive level representative of the out of phase. The flip-flop circuit 20 is responsive to the delay of the control signal 108 so as to change the control signal 111 from the high level to the low level representative of the count-down mode. The control signal 111 is supplied to the frequency comparator 16 and the control node UD of the counter 11. The control signal 111 makes the frequency comparator 16 deactivated, and, accordingly, the frequency comparator 16 fixes the control signal 107 to the inactive level. The control signal 107 is supplied to the switching circuits 12/17. The switching circuit 12 transfers the pulse signal 103/110 to the clock node CK of the counter 11. The counter 11 decreases the binary number stored therein in response to the pulse signal 110. Accordingly, the digital-to-analog converter 13 decreases the magnitude of the control voltage signal 104. When the count reaches 00, the counter 11 changes the reset signal 112 to the active level, and resets the flip-flop circuit 20. Then, the flip-flop circuit 20 changes the control signal 111 to the high level representative of the count-up mode. The control signal 111 of the high level makes the frequency comparator 16 active, and the counter 11 change the operation to the count-up mode. Then, the self-tunable oscillating circuit 1 repeats the circuit behavior described hereinbefore in conjunction with the input frequency f1.

As will be understood, the frequency comparator 16, the detector 18 and the flip-flop circuit 20 increase the count and, accordingly, the magnitude of the control voltage signal 104 until the frequency of the free-running oscillation signal 105 becomes close to the frequency of the input signal, and, thereafter, the phase comparator 15 makes the phase of the free-running oscillation signal 105 coincident with the phase of the input signal. In other words, the self-tunable oscillating circuit synchronizes the free-running oscillation signal with the input signal through the two-stage phase control. Even if the voltage-to-frequency characteristics of the oscillator 14 are dispersed among the products, the dispersion is taken up through the two-stage phase control, and any external regulator is not required.

Second Embodiment

Figure 12:
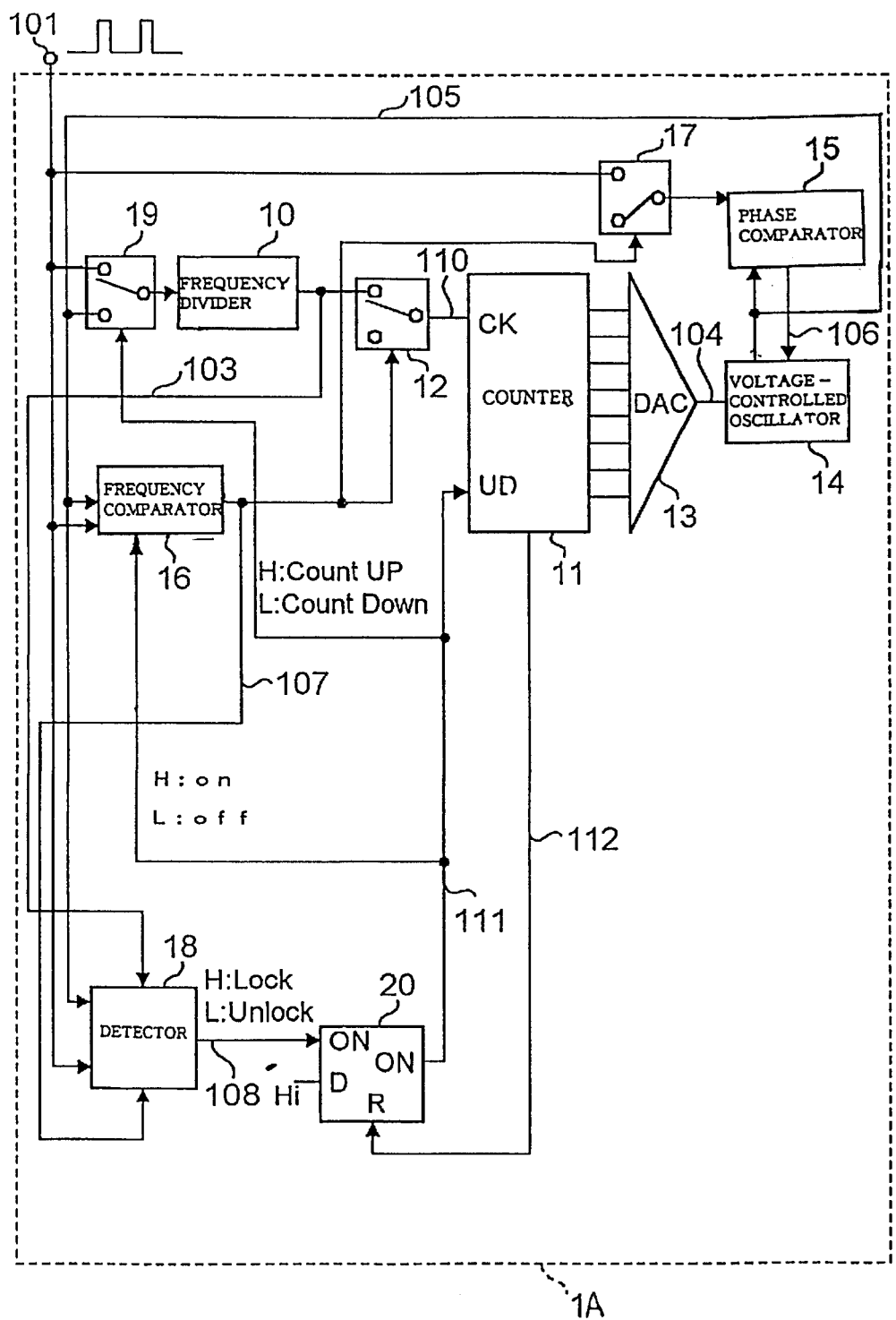
FIG. 12 is a block diagram showing the circuit configuration of another self-tunable oscillating circuit according to the present invention.

FIG. 12 illustrates another self-tunable oscillating circuit 1A embodying the present invention. The self-tunable oscillation circuit 1A is similar in circuit configuration to the self-tunable oscillation circuit 1 except a switching circuit 19. For this reason, the other circuit components are labeled with the same references designating corresponding circuit components of the self-tunable oscillating circuit 1 without detailed description.

The switching circuit 19 has two input nodes and an output node. One of the input nodes is connected to the input node 101, and the other input node is supplied with the free-running oscillation signal 105. The output node is connected to the input node of the frequency divider 10.

The switching circuit 19 is responsive to the control signal 111 so as to change the source of input signal. In detail, when the control signal 111 is changed to the low level representative of the count-down mode, the switching circuit 19 transfers the free-running oscillation signal to the frequency divider 10. In a commercial operation, there is a possibility that the input signal does not oscillate in a short period. In this situation, the detector 18 changes the control signal 108 to the low level representative of the unlocked state, and the flip-flop circuit 20 changes the control signal 111 to the low level representative of the count-down mode. The counter 11 is required to decrease the binary number stored therein in response to the pulse at the clock node CK. However, if the input signal is supplied to the frequency divider 10, the counter 11 does not decrease the binary number stored therein, because any pulse is not supplied to the clock node CK. In the second embodiment, the switching circuit 19 transfers the free-running oscillation signal 105 instead of the input signal. The frequency divider 10 produces the pulse signal 103/110 from the free-running oscillation signal 105, and allows the counter 11 to decrease the binary number stored therein in response to the pulse signal 110 produced from the free-running oscillation signal 105.

Finally, the self-tunable oscillating circuits 1/1A internally produces the pulse signal 103/110 from the input signal. This feature is desirable, because any other pulse source is neither required, nor additional pins.

In the above-described embodiments, the frequency comparator 16, the detector 18, the flip-flop circuit 20, the frequency divider 10, the switching circuits 12/17, the counter 11, the digital-to-analog converter 13 and the signal lines therebetween as a whole constitute a first control loop. In the second embodiment, the switching circuit 19 is further incorporated in the first control loop. The phase comparator 15 and the signal lines between the voltage-controlled oscillator 14 and the phase comparator 15 form in combination a second control loop.

As will be appreciated from the foregoing description, when the input signal and the free-running oscillation signal are out of phase, the first control loop varies the control voltage signal 104 so as to make the control range of the voltage-controlled oscillator 14 in the vicinity of the input signal, and, thereafter, the phase comparator 15 makes the free-running oscillation signal synchronous with the input signal. Even if the voltage-to-frequency characteristics of the voltage-controlled oscillator 14 is out of a designed range, the first control loop brings the voltage-to-frequency characteristics into the vicinity of the frequency of the input signal so that any external regulator is not required.

Although particular embodiments of the present invention have been shown and described, it will be apparent to those skilled in the art that various changes and modifications may be made without departing from the spirit and scope of the present invention. As described hereinbefore, the self-tunable oscillating circuits 1/1A firstly decrease the count to 00, and, thereafter, increase the count to a binary number appropriate to the voltage-controlled oscillator 14. This is because of the fact that component transistors of the monitor displays are liable to be broken due to the abrupt change of the output frequency of the voltage-controlled oscillator 14. The counter 11 prevents the component transistors from the breakage through the count-down operation before the regulation of the oscillation frequency. However, if the problem is less liable to take place in an application, the counter 11 may be reset to zero without the count-down operation. In this instance, the control signal 108 may be supplied to the counter 11 as the reset signal, and the detector 18 keeps the frequency comparator 16 active at all times.

Moreover, the frequency comparator 16 is deactivated during the countdown operation in the above-described embodiments. The frequency comparator 16 may be remodeled in such a manner as to output the control signal 107 of the active level when the number of pulses exceeds the submultiple n. The modification is desirable, because the modification regulates the free-running oscillation signal at a higher speed in case where the input signal is varied from the high frequency to a low frequency.

What is claimed is:

1. An oscillating circuit for producing an output signal synchronous with an input signal, comprising:

a signal input node effective to receive said input signal;

a voltage-controlled oscillator including a feedback loop having voltage-to-frequency characteristics achieved in a certain control range, and responsive to a control voltage signal effective to change a frequency of said output signal;

a control loop connected to said signal input node and said voltage-controlled oscillator so as to compare said frequency of said output signal with a frequency of said input signal to see whether the difference between said input and output signals falls within said certain control range, and changing a first sub-signal of said control voltage signal so as to make said frequency of said output signal substantially coincident with said frequency of said input signal when said difference is out of said certain control range; and said feedback loop is connected to said signal input node and said voltage-controlled oscillator, and controls said voltage-controlled oscillator with a second sub-signal of said control voltage signal so as to make said output signal and said input signal in-phase when said difference is within said certain control range.

2. The oscillating circuit as set forth in claim 1, wherein said control loop includes:

a frequency comparator comparing said frequency of said output signal with said frequency of said input signal to see whether said difference between said input signal and said output signal falls within said certain control range so as to produce a first control signal representative of the result of comparison, and a first control signal generator connected between said frequency comparator and said voltage-controlled oscillator and responsive to said first control signal so as to vary said first sub-signal.

3. The oscillating circuit as set forth in claim 1, wherein said feedback loop includes a phase comparator connected to said voltage-controlled oscillator so as to produce said second sub-signal.

4. The oscillating circuit as set forth in claim 2, wherein said control signal generator includes:

a counter changing a count stored therein on the basis of a pulse train produced from said input signal while said first control signal is representing that said input signal is out of said certain control range, and a converter connected between said counter and said voltage-controlled oscillator and changing said first sub-signal to a magnitude corresponding to said count.

5. The oscillating circuit as set forth in claim 4, wherein said control loop further includes a frequency divider connected to said counter for producing said pulse train from said input signal.

6. The oscillating circuit as set forth in claim 5, wherein said first control signal generator further includes:

a second control signal generator connected between said frequency comparator and said counter and responsive to said first control signal so as to produce a second control signal of a first level representative of a count-down operation when said frequency comparator finds that said output signal and said input signal are out of phase, said second control signal generator changing said second control signal to a second level representative of a count-up operation when said count reaches a threshold value through said count-down operation.

7. The oscillator as set forth in claim 6, wherein said second control signal generator includes:

a detector connected to said frequency comparator and responsive to said first control signal for producing a third control signal representative of one of locked state and unlocked state, and a flip-flop circuit connected between said detector, a source of said second level and said counter and responsive to said third control signal so as to change said second control signal between said first level and said second level.

8. The oscillating circuit as set forth in claim 7, wherein said detector is activated after a delay time from the production of said first control signal representative of said difference being out of said certain control range.

9. The oscillating circuit as set forth in claim 6, wherein said frequency comparator is deactivated while said second control signal is representing said count-down operation.

10. The oscillating circuit as set forth in claim 6, wherein said control loop further includes:

a first switching circuit connected between said frequency divider and said counter and transferring said pulse train to said counter while said first control signal is representing said input signal out of said certain control range, and a second switching circuit connected between said signal input node and said feedback loop and transferring said input signal to said second switching circuit while said first control signal is representing said input signal falls within said certain control range.

11. The oscillating circuit as set forth in claim 10, wherein said control loop further includes a third switching circuit having input nodes respectively connected to said signal input node and said voltage-controlled oscillator and an output node connected to said frequency divider and responsive to said second control signal representative of said count-up operation so as to transfer said input signal to said frequency divider, said third switching circuit being further responsive to said second control signal representative of said count-down operation so as to transfer said output signal to said frequency divider.

12. An oscillating circuit for producing an output signal substantially synchronous with an input signal, said oscillating circuit comprising:

a signal input node effective to receive said input signal;

a voltage-controlled oscillator including a feedback loop having a voltage-to-frequency characteristic effective within a control range, said voltage-controlled oscillator being effective to receive a control voltage signal and output said output signal in response to said control voltage signal;

a control loop connected to said signal input node and said voltage-controlled oscillator, said first control loop including a comparator which compares said frequency of said output signal with a frequency of said input signal and determines a difference therebetween, said first control loop alters said control voltage signal so as to alter said output signal and thereby make said difference fall within said certain control range when said difference is out of said certain control range; and said feedback loop is connected to said signal input node and said voltage-controlled oscillator, said feedback loop controls said voltage-controlled oscillator with a second sub-signal of said control voltage signal so as to make said output signal and said input signal in-phase.

* * * * *